(12) United States Patent  (10) Patent No.: US 6,428,937 B1
Katakura                   (45) Date of Patent:   Aug. 6, 2002

(54) METHODS FOR FABRICATING RETICLE BLANKS FOR USE IN MAKING CHARGED-PARTICLE-BEAM MICROLITHOGRAPHY RETICLES, AND RETICLE BLANKS AND RETICLES FORMED USING SUCH METHODS

(75) Inventor: Norihiro Katakura, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/572,723

(22) Filed: May 16, 2000

(30) Foreign Application Priority Data

May 17, 1999 (JP) ............................. 11-135701

(51) Int. Cl.$^7$ ................................. G03F 9/00
(52) U.S. Cl. ........................................... 430/5
(58) Field of Search ................ 430/5, 296; 378/35; 250/492.22, 492.23

(56) References Cited

U.S. PATENT DOCUMENTS 6,221,537 B1 * 4/2001 Thompson et al. ............ 430/5

* cited by examiner

Primary Examiner—S. Rosasco
(74) Attorney, Agent, or Firm—Klarquist Sparkman LLP (57) ABSTRACT

Methods are disclosed for manufacturing reticle blanks useful for forming reticles used in charged-particle-beam microlithography. The reticle blanks are formed that comprise support struts having sharply defined, vertical sidewalls without "icicles" being formed near or on the sidewalls. According to an exemplary method, an SOI (silicon-on-insulator) substrate is formed from a silicon support substrate, a silicon oxide layer on a first major surface of the silicon support substrate, and an SOI layer formed on the silicon oxide layer. A dry-etching mask is formed on a second major surface of the silicon support substrate. The mask defines windows in positions between which struts are to be formed. The dry-etching mask comprises a thin (desirably 1 $\mu$m to 2 $\mu$m thick) silicon oxide layer and a resist layer. The windows are dry-etched to form the struts, and the silicon oxide layer is removed.

20 Claims, 5 Drawing Sheets

METHODS FOR FABRICATING RETICLE BLANKS FOR USE IN MAKING CHARGED-PARTICLE-BEAM MICROLITHOGRAPHY RETICLES, AND RETICLE BLANKS AND RETICLES FORMED USING SUCH METHODS

FIELD OF THE INVENTION

This invention pertains to microlithography (projection-transfer) in which a pattern, defined on a mask or reticle, is projected (and thus "transferred") to a suitable substrate using a charged particle beam such as an electron beam. This type of microlithography has especial utility in the fabrication of integrated circuits and displays. More particularly, the invention pertains to "reticle blanks" from which reticles for charged-particle-beam (CPB) microlithography can be made, reticles made from such reticle blanks, and to methods for making such reticle blanks and reticles.

BACKGROUND OF THE INVENTION

In recent years, as semiconductor integrated circuits have become increasingly miniaturized, the resolution limits of optical microlithography (i.e., projection-transfer of a pattern performed using ultraviolet light as an energy beam) have become increasingly apparent. As a result, considerable development effort currently is being expended to develop microlithography methods and apparatus that employ an alternative type of energy beam that offers prospects of better resolution than optical microlithography. For example, considerable effort has been directed to use of X-rays. However, a practical X-ray system has not yet been developed because of many technical problems with that technology. Another candidate microlithography technology utilizes a charged particle beam, such as an electron beam or ion beam, as an energy beam.

A current type of electron-beam pattern-transfer system is an electron-beam inscribing system that literally "draws" a pattern on a substrate using an electron beam. In such a system, no reticle is used. Rather, the pattern is drawn line-by-line. These systems can form intricate patterns having features sized at 0.1 $\mu$m or less because, inter alia, the electron beam itself can be focused down to a spot diameter of several nanometers. However, with such systems, the more intricate the pattern, the more focused the electron beam must be in order to draw the pattern satisfactorily. Also, drawing a pattern line-by-line requires large amounts of time; consequently, this technology has very little utility in the mass production of semiconductor wafers where "throughput" (number of wafers processed per unit time) is an important consideration.

In view of the shortcomings in electron-beam drawing systems and methods, charged-particle-beam (CPB) projection-microlithography systems have been proposed in which a reticle defining the desired pattern is irradiated with a charged particle beam. The portion of the beam passing through the irradiated region of the reticle is "reduced" (demagnified) as the image carried by the beam is projected onto a corresponding region of a wafer or other suitable substrate using a projection lens.

Figure 3A:
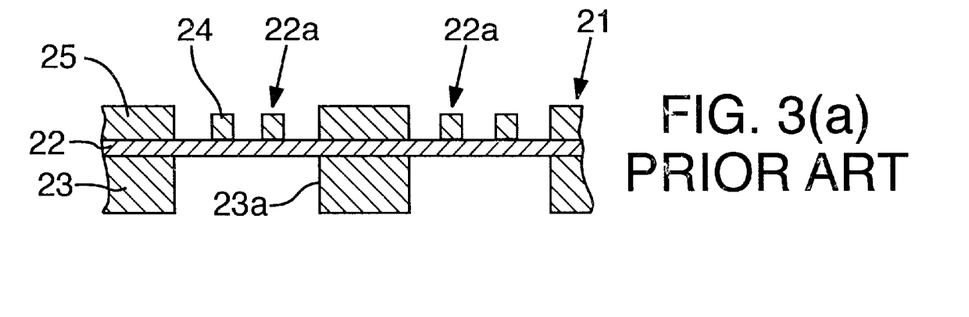
FIG. 3(a) is an elevational sectional view of a portion of a conventional scattering-membrane reticle.
Figure 3B:
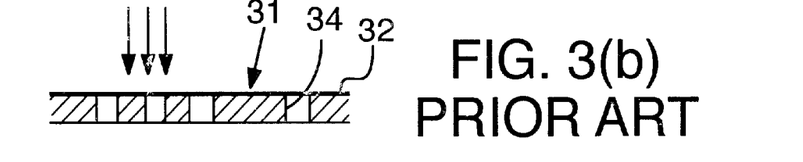
FIG. 3(b) is an elevational sectional view of a portion of a conventional scattering-stencil reticle.

The reticle is generally of two types. One type is a scattering-membrane reticle 21 as shown in FIG. 3(a), in which pattern features are defined by scattering bodies 24 formed on a membrane 22 that is relatively transmissive to the beam. A second type is a scattering-stencil reticle 31 as shown in FIG. 3(b), in which pattern features are defined by beam-transmissive through-holes 34 in a membrane 32 that tends to scatter particles in the beam. The membrane 32 is normally silicon with a thickness of approximately 2 $\mu$m.

Because, from a practical standpoint, an entire reticle pattern cannot be projected simultaneously onto a substrate using a charged particle beam, conventional CPB microlithography reticles are divided or segmented into multiple "subfields" 22a, 32a each defining a respective portion of the overall pattern. The subfields 22a, 32a are separated from one another on the membrane 22, 32 by boundary regions (items 25 in FIG. 3(a)) that do not define any pattern features. In order to provide the membrane 22, 32 with sufficient mechanical strength and rigidity, support struts 23, 33 extend from the boundary regions 25.

Figure 3C:
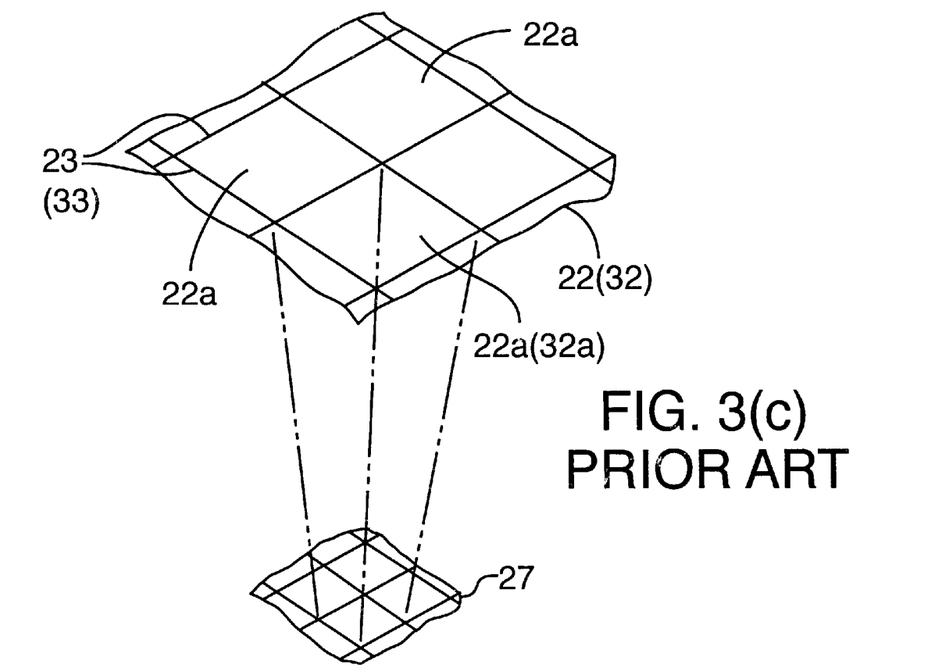
FIG. 3(c) is a schematic oblique view showing certain conventional aspects of exposure of a pattern from a reticle to a sensitive substrate using a charged particle beam.

Each subfield 22a, 32a typically measures approximately 1-mm square. The subfields 22a, 32a are arrayed in columns and rows across the reticle 21, 31. For projection-exposure, the subfields 22a, 32a are illuminated in a step-wise manner by the charged particle beam (serving as an "illumination beam"). As the illumination beam passes through each subfield, the beam becomes "patterned" according to the configuration of pattern elements in the subfield. As depicted in FIG. 3(c), the patterned beam propagates through a projection-optical system (not shown) to the sensitive substrate 27. (By "sensitive" is meant that the substrate is coated on its upstream-facing surface with a material, termed a "resist," that is imprintable with an image of the pattern as projected from the reticle.) The images of the subfields have respective locations on the substrate 27 in which the images are "stitched" together (i.e., situated contiguously) in the proper order to form the entire pattern on the substrate.

Certain steps of a conventional method for fabricating a reticle are depicted in FIGS. 4(a)–4(d), respectively. In a first step, an "SOI" (Silicon On Insulator) substrate 40 is made from a silicon support substrate 41, a silicon oxide layer 42, and an SOI layer 43, using conventional fabrication techniques (FIG. 4(a)). The silicon oxide layer 42 is formed on a first major surface 50 of the silicon support substrate 41, and the SOI layer 43 is formed on the silicon oxide layer 42. In a second step, a dry-etching mask 46, made from a thick film of silicon oxide or resist, is formed on or applied to, respectively, the second major surface 51 of the silicon support substrate 41 (FIG. 4(b)). The dry-etching mask 46 defines openings 45 in which corresponding regions of the second major surface 51 are exposed. The silicon support substrate 41 exposed in the openings 45 is dry-etched (FIG. 4(c)).

The silicon support substrate 41 is dry-etched depthwise to the silicon oxide layer 42 that acts as an etch-stop barrier. In the resulting structure, the silicon oxide layer 42 and the SOI layer 43 are supported by a silicon peripheral frame 41b and silicon struts 41a contiguous with the peripheral frame 41b. Each strut 41a is approximately several hundreds of $\mu$m wide. The struts 41a are spaced apart from one another so as to leave open areas between the peripheral frame 41b and the struts 41a, and between individual struts 41a.

Figure 4A:
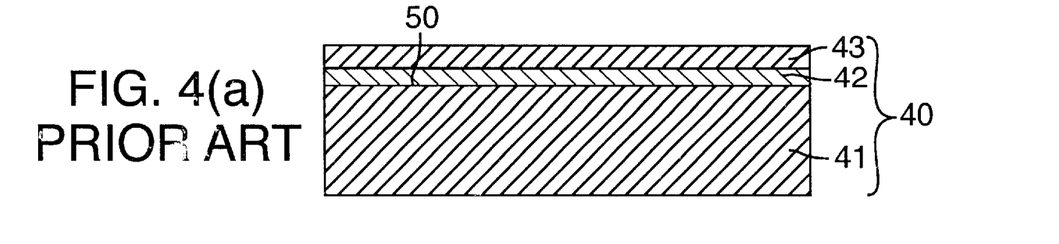
FIGS. 4(a)–4(d) depict (in respective schematic vertical sections) certain steps in a conventional method for fabricating a CPB microlithography reticle from a reticle blank.
Figure 4B:
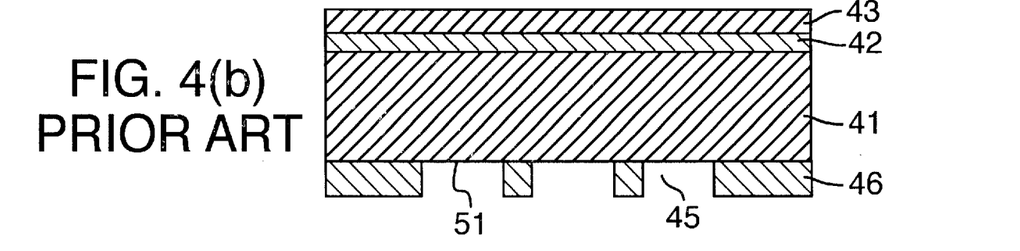
Figure 4C:
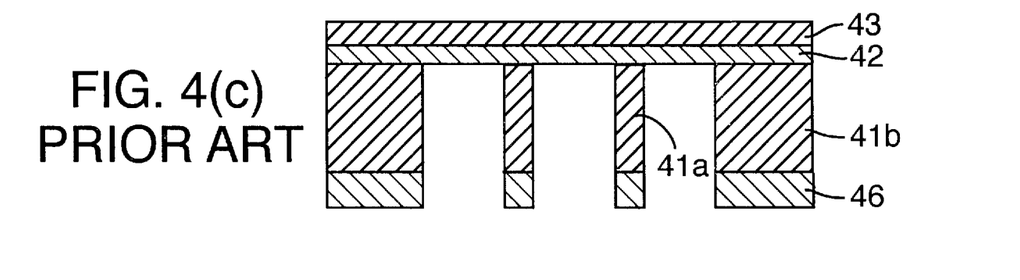
Figure 4D:
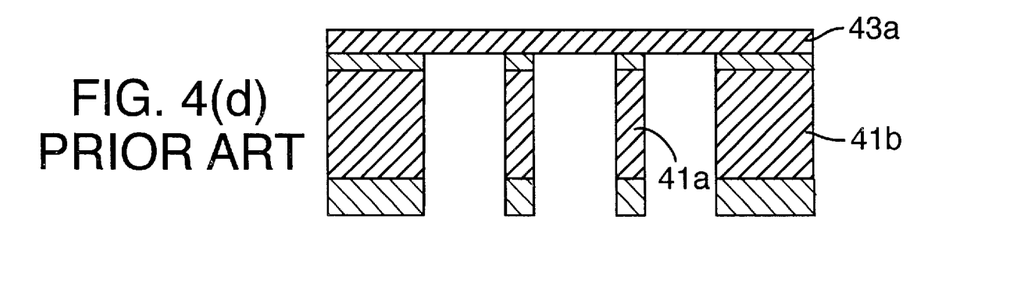

As evident in FIG. 4(c), the silicon oxide layer 42 is exposed in the openings between struts. The exposed silicon oxide 42 is removed using a mixture of HF+NH$_3$F, leaving the SOI layer 43 to become a reticle membrane 43a (FIG. 4(d)), thereby completing manufacture of a reticle "blank."

In the foregoing method, dry-etching must be performed to a depth equal to the thickness of the silicon support substrate 41 of the SOI substrate 40. For example, in the case of an SOI substrate 40 having a diameter of 3 inches, dry-etching is performed to a depth of at least 300 $\mu$m. In the case of an SOI substrate 40 having a diameter of 8 inches, dry-etching is performed to a depth of at least 700 $\mu$m.

Conventionally, if dry-etching is to be performed to a depth of at least 700 μm, then a silicon oxide layer used as a dry-etching-mask desirably is at least approximately 10 μm thick. (This is because the etching selectivity for silicon relative to silicon oxide is about 100:1. Hence, 700 μm/100=7 μm, which is approximately 10 μm.) A resist layer used as a dry-etching mask conventionally is 50 μm to 60 μm thick. (The etching selectivity for silicon relative to resist is about 20:1. Hence, 700 μm/20=35 μm, which is approximately equal to 50 μm.)

The dry-etching technique summarized above is performed according to the well-known sidewall-protecting plasma dry-etching technique. Sidewall-protecting plasma dry-etching protects the sidewalls of the cavities being formed by inhibiting the etching away of surrounding structure. The sidewalls are protected by flowing a mixture of the silicon-etching gas and a sidewall-protecting gas. Upon contacting the side walls, the sidewall-protecting gas in the mixture polymerizes and forms polymer deposits on the sidewalls. The polymer deposits tend to protect the sidewalls from further dry-etching so that dry-etching proceeds preferentially in the thickness direction while lateral dry-etching into the sidewalls is suppressed.

Examples of gas mixtures for performing dry-etching while protecting sidewalls are $Cl_2+CHF_3$, $SF_6+C_3H_8$, and $SF_6+CCl_4$. These gas mixture from a protective film by polymerization of $CHF_3$, $C_3H_8$, or $CCl_4$, respectively. With polymer deposits on the sidewalls, dry-etching of the silicon tends to progress in the thickness direction by action of the $Cl_2$ or $SF_6$.

Conventionally, whenever a dry-etching mask 46 is made from a thick layer of silicon oxide, the underlying SOI substrate 40 tends to become distorted by stresses in the silicon oxide mask 46. Consequently, the silicon oxide mask 46 tends to exhibit peeling from the SOI substrate 40 as the mask 46 is being formed.

Figure 5A:
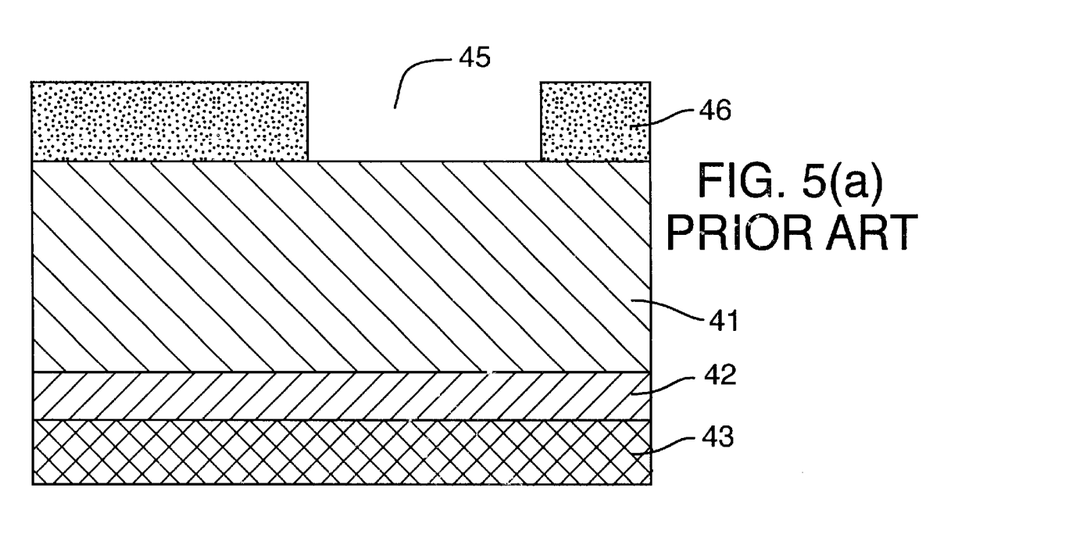
Figure 5B:
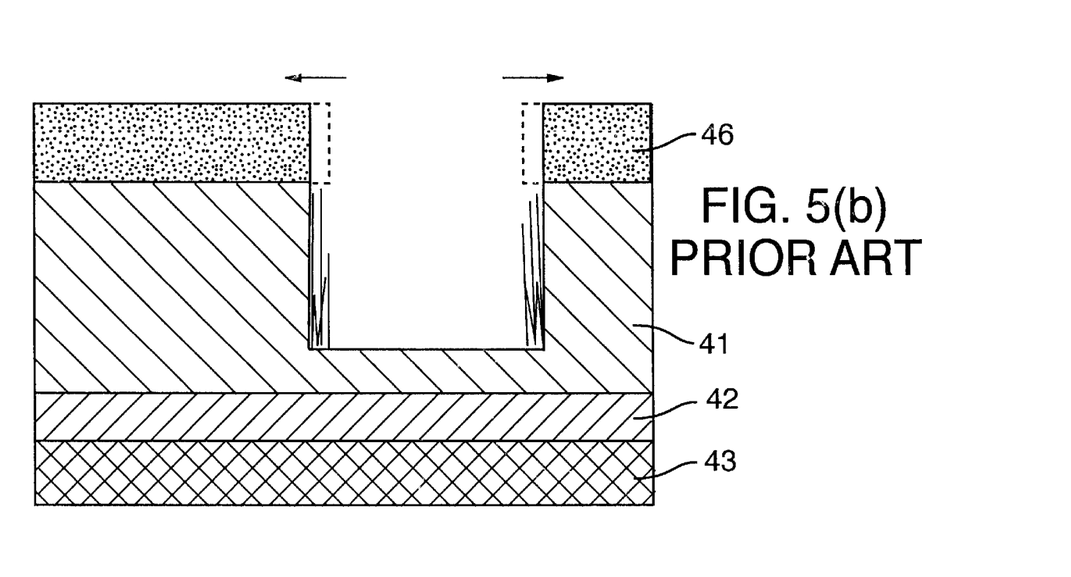

A dry-etching mask conventionally made solely from a layer of resist has a poor etching-selectivity ratio. To solve this problem, the resist layer is conventionally made several tens of μm thick. However, since the resist itself also is etched during dry-etching (i.e., the resist has poor durability With respect to dry-etching), the edges of the openings in the resist recede (i.e., the openings in the resist enlarge) as dry-etching progresses, as shown in FIGS. 5(a)–5(b). Hence, by the time that dry-etching through the thickness of the silicon support substrate 41 is completed, the edges of the openings have receded (arrows in FIG. 5(b)) laterally beyond the sidewall-protective film. When dry-etching is performed under conditions in which the openings in the resist are enlarging, dry-etching occurs behind the sidewall-protective film into silicon that should be protected by the sidewall-protective film. As a result, icicle-like projections are formed along the sidewalls that are detached easily and create troublesome debris.

SUMMARY OF THE INVENTION

In view of the shortcomings of conventional methods, as summarized above, an object of the present invention is to provide methods for fabricating reticle blanks for charged-particle-beam (CPB) microlithography in which struts can be formed having sharply defined, vertical sidewalls, without the attendant formation of "icicles" on or near the sidewalls.

According to a representative embodiment of a method, according to the invention, for manufacturing a reticle blank, a first step includes preparing an SOI substrate. The SOI substrate comprises a silicon support substrate and an etch-stop layer formed on a first major surface of the silicon support substrate. By way of example, the etch-stop layer is a silicon oxide layer and the membrane-forming layer is an SOI layer. A dry-etching mask is formed on a second major surface of the silicon support substrate. The dry-etching mask comprises a thin (desirably 1 μm to 2 μm thick) silicon oxide layer formed on the second major surface and a resist layer (desirably 20 μm to 30 μm thick) formed on the silicon oxide layer. The dry-etching mask defines a pattern of windows located at positions corresponding to spaces to be located between struts of the reticle blank. According to the pattern of windows in the dry-etching mask, the silicon support substrate is dry-etched. Afterward, exposed portions of the etch-stop layer and remaining portions of the dry-etching mask are removed to complete formation of the reticle blank. The reticle blank can be used to form a reticle.

As noted above, in manufacturing the reticle blank, a dry-etching mask is formed on the second major surface of the silicon support substrate side. The dry-etching mask is formed from a thin (desirably 1 μm to 2 μm thick) silicon oxide layer, formed on the second major surface, and a resist layer is formed on the silicon oxide layer. Even if the resist recedes during dry-etching, the dry-etching gas nevertheless will be blocked by the underlying silicon oxide layer from forming "icicles" on side walls of recesses formed in the silicon support substrate. Consequently, if dry-etching is performed under conditions in which a sidewall-protective film is formed, the sidewall surfaces intended to be protected by the protective film are not dry-etched, thereby preventing the formation of "icicles" on or near the sidewalls and preventing formation of debris.

In addition, because the silicon oxide layer in the dry-etching mask is thin (1 μm to 2 μm) compared to conventional practice (at least 10 μm thick), the silicon oxide layer imparts very little stress to the silicon support substrate.

The foregoing and additional aspects, features, and advantages of the invention will be more readily apparent from the following detailed description, which proceeds with reference to the accompanying drawings.

BRIEF DESCRIPTION OF THE DRAWINGS

FIGS. 5(a)–5(b) are vertical profiles showing the formation of sidewall "icicles" in a conventional process for making a reticle blank, wherein FIG. 5(a) shows a condition extant before commencing dry-etching to form struts, and FIG. 5(b) shows a condition extant during or after dry-etching.

DETAILED DESCRIPTION

Representative embodiments of respective methods according to the invention, for fabricating a reticle blank and for fabricating a reticle from the reticle blank, are described below. It will be understood, however, that the invention is not limited to these particular embodiments.

Figure 1A:
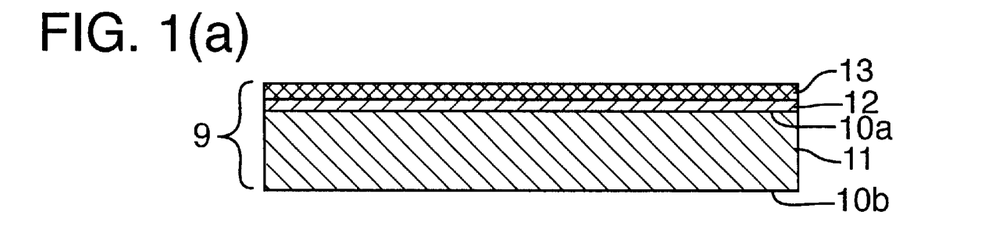
FIGS. 1(a)–1(f) depict (in respective schematic vertical sections) the results of certain steps of a process, according to the invention, for manufacturing reticle blanks used for forming charged-particle-beam (CPB) microlithography reticles.

Referring to FIG. 1(a), in a first step, an SOI (Silicon On Insulator) substrate 9 is fabricated from a silicon support substrate 11. By way of example, the SOI substrate comprises a silicon oxide layer 12 (as an exemplary etch-stop layer) and an 501 layer 13 (as an exemplary membrane-forming layer). More specifically, in the figure, the silicon oxide layer 12 is formed on a first major surface 10a of the silicon support substrate 11, and the SOI layer 13 is formed on the silicon oxide layer 12. These layers can be formed using known techniques.

Figure 1B:
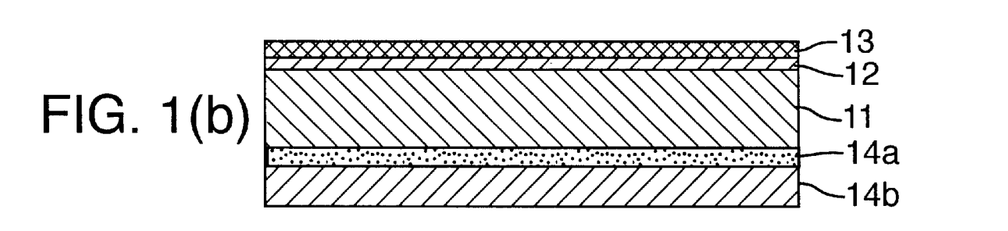

In a second step, shown in FIG. 1(b), a thin silicon oxide layer 14a (desirably approximately 1 μm to 2 μm thick) is formed on the second major surface 10b of the SOI substrate 9. A resist layer 14b (desirably approximately 20 μm to 30 μm thick) is applied to the silicon oxide layer 14a.

Figure 1C:
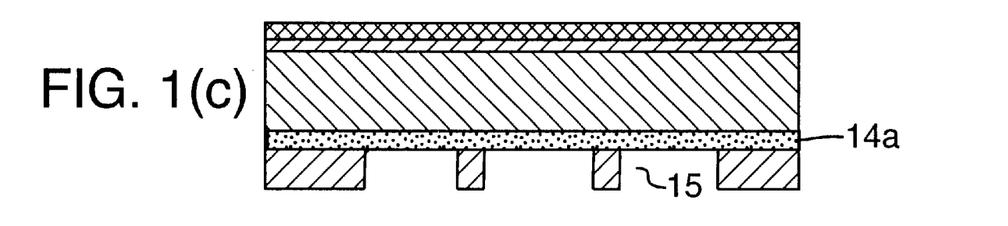
Figure 1D:
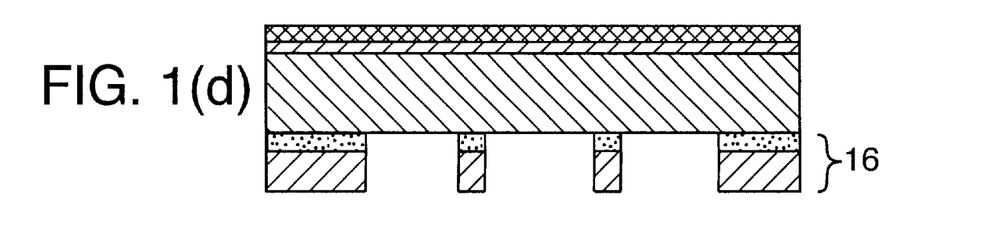

In FIG. 1(c), a pattern of "windows" (openings) 15 is inscribed in selected regions of the resist layer 14b by a electron-beam drawing or other suitable technique. The windows 15 define intervening positions at which struts will be formed in a later step. Using the patterned resist 14b as a mask, the exposed regions of the silicon oxide layer 14a are etched away using, e.g., a mixture of hydrofluoric acid and ammonium fluoride, thereby producing a dry-etching mask 16 (FIG. 1(d)).

Figure 1E:
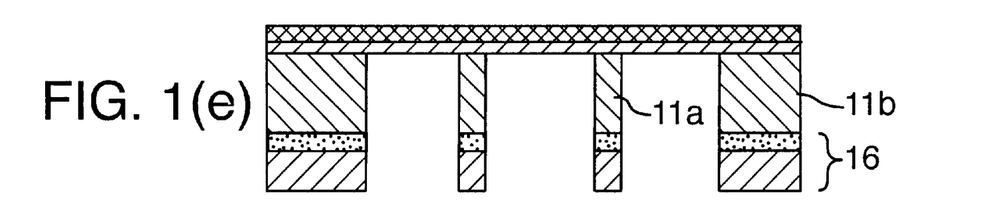

The regions of the silicon support substrate 11 not covered by the dry-etching mask 16 are dry-etched (FIG. 1(e)). Dry-etching proceeds into the thickness dimension of the silicon support substrate 11 as far as the silicon oxide layer 12, forming a structure in which the silicon oxide layer 12 and the SOI layer 13 are supported by a peripheral frame 11b and struts 11a formed by remaining portions of the silicon support substrate 11. Openings between the peripheral frame 11b and the silicon struts 11a, and between the silicon struts 11a, correspond to the pattern of windows 15.

Next, regions of the silicon oxide layer 12 that are exposed in the windows 15 are removed using hydrofluoric acid, leaving the SOI layer 13 as a reticle-blank membrane 13a. Also, the dry-etching mask 16 is removed to complete formation of the reticle blank RB (FIG. 1(f)).

Figure 1F:
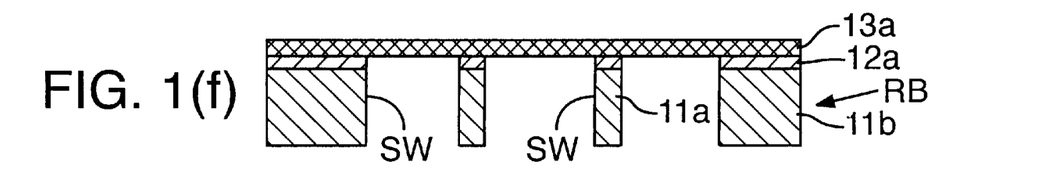

The foregoing process is described as a so-called "back-etching pre-process." In such a process, a reticle is formed from the reticle blank RB shown in FIG. 1(f). To such end, a reticle pattern is formed in or on the membrane 13a after the step represented by FIG. 1(f). The reticle can be, e.g., a "scattering-membrane" reticle or a "scattering-stencil" reticle as discussed above. Alternatively, a reticle can be produced by a so-called "back-etching post-process." In the back-etching post-process, the reticle pattern is formed in or on the SOI layer 13 of an SOI substrate 9 before the silicon support substrate 11 and silicon oxide layer 12 are dry-etched to form the struts 11a and peripheral frame 11b.

Figure 2A:
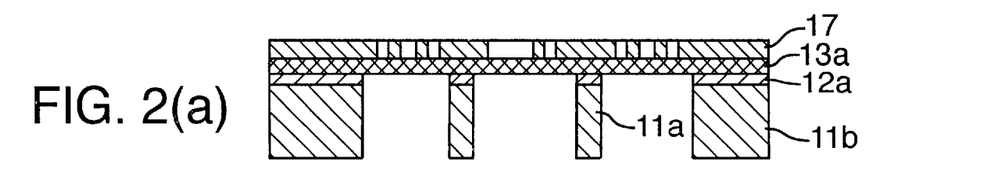
FIGS. 2(a)–2(c) depict (in respective schematic vertical sections) the results of certain steps of a representative process, according to the invention, for fabricating a scattering-stencil reticle for CPB microlithography. The pattern features are defined by through-holes in a reticle membrane of the reticle blank formed according to the process shown in FIGS. 1(a)–1(f).
Figure 2B:
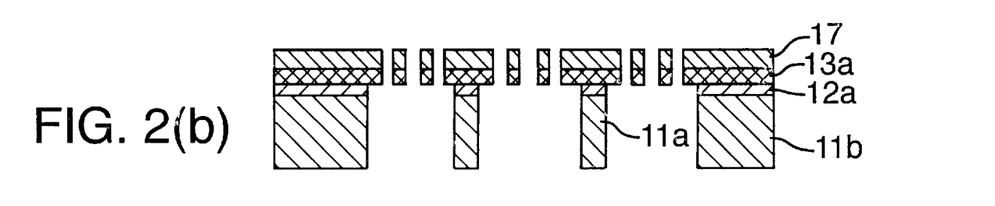
Figure 2C:
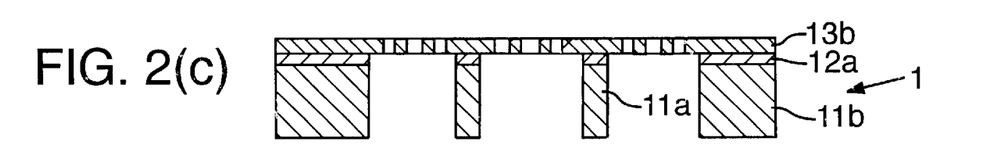

FIGS. 2(a)–2(c) depict certain respective steps of a representative process for forming a scattering-stencil reticle from the reticle blank RB shown in FIG. 1(f). In a first step, a resist 17 is applied to the membrane 13a of the reticle blank RB. A desired reticle pattern is imprinted into the resist 17 using an electron-beam drawing apparatus or other suitable technique (FIG. 2(a)). Using the patterned resist 17 as a mask, the membrane 13a is etched (FIG. 2(b)) to form the reticle pattern in the membrane 13a. Upon removing the remaining resist 17, the scattering-stencil reticle 1 is completed (FIG. 2(c)).

Alternatively, a pattern configured in the manner of a scattering-membrane reticle can be formed on the membrane 17 using known techniques.

Fabrication of a reticle blank RB as described above provides struts 11a and peripheral frame 11b exhibiting sharp vertical sidewalls SW, without "icicles" in the vicinity of the sidewalls SW. These results are obtained even when the reticle blank RB is formed from a large-diameter SOI substrate 9 or when the struts 11a and peripheral frame 11b must be formed by unusually deep dry-etching.

Whereas the invention has been described in connection with representative embodiments, it will be apparent that the invention is not limited to those embodiments. On the contrary, the invention is intended to encompass all modifications, alternative, and equivalents as may be included within the spirit and scope of the invention, as defined by the appended claims.

What is claimed is:

1. A method for manufacturing a reticle blank for use in making a reticle for charged-particle-beam microlithography, the method comprising the steps:

preparing an SOI substrate comprising a silicon support substrate, an etch-stop layer formed on a first major surface of the silicon support substrate, and a membrane-forming layer formed on the etch-stop layer;

forming a dry-etching mask on a second major surface of the silicon support substrate, the dry-etching mask comprising a silicon oxide layer formed on the second major surface and a resist layer applied to the silicon oxide layer, the dry-etching mask defining a pattern of windows located at positions corresponding to spaces to be located between struts of the reticle blank;

according to the pattern of windows in the dry-etching mask, dry-etching the silicon support substrate; and removing exposed portions of the etch-stop layer and remaining portions of the dry-etch mask to form the reticle blank including a membrane formed by the membrane-forming layer.

2. The method of claim 1, wherein the dry-etching is performed in the presence of a sidewall-protective gas.

3. The method of claim 1, wherein the silicon oxide layer has a thickness of 1 μm to 2 μm.

4. The method of claim 3, wherein the resist layer has a thickness of 20 μm to 30 μm.

5. The method of claim 1, wherein the etch-stop layer is a silicon oxide layer.

6. The method of claim 5, wherein the membrane-forming layer is an SOI layer.

7. The method of claim 1, wherein the membrane-forming layer is an SOI layer.

8. A reticle blank formed by the method of claim 1.

9. A method for forming a reticle for charged-particle-beam microlithography, comprising the steps: providing a reticle blank as recited in claim 1; and forming a pattern of features on or in the membrane.

10. The method of claim 9, wherein the pattern of features is formed on the membrane so as to form a scattering-membrane reticle.

11. The method of claim 9, wherein the pattern of features is formed in the membrane so as to form a scattering-stencil reticle.

12. A reticle produced by the method of claim 9.

13. The reticle of claim 12 that is a scattering-membrane reticle.

14. The reticle of claim 12 that is a scattering-stencil reticle.

15. A method for forming a reticle blank for use in making a reticle for charged-particle-beam microlithography, the method comprising the steps:

preparing an SOI substrate comprising a silicon support substrate, an etch-stop layer formed on a first major surface of the silicon support substrata, and a membrane-forming layer formed on he etch-stop layer;

forming a dry-etching mask on a second major surface of the silicon support substrate, the dry-etching mask comprising a silicon oxide layer formed on the second major surface and a resist layer applied to the silicon oxide layer, the dry-etching mask defining a pattern of windows located at positions corresponding to spaces to be located between struts of the reticle blank;

forming a pattern of features on or in the membrane-forming layer;

according to the pattern of windows in the dry-etching mask, dry-etching the silicon support substrate; and removing exposed portions of the etch-stop layer and remaining portions of the dry-etch mask to form the reticle blank including a membrane formed by the membrane-forming layer.

16. The method of claim 15, wherein the pattern of features is formed on the membrane so as to form a scattering-membrane reticle.

17. The method of claim 15, wherein the pattern of features is formed in the membrane so as to form a scattering-stencil reticle.

18. A reticle produced by the method of claim 15.

19. The reticle of claim 18 that is a scattering-membrane reticle.

20. The reticle of claim 18 that is a scattering-stencil reticle.

* * * * *

UNITED STATES PATENT AND TRADEMARK OFFICE
CERTIFICATE OF CORRECTION

PATENT NO. : 6,428,937 B1 Page 1 of 1
DATED : August 6, 2002
INVENTOR(S) : Katakura It is certified that error appears in the above-identified patent and that said Letters Patent is hereby corrected as shown below:

Column 5,
Line 16, "501" should be -- SOI --.
Line 28, "a electron" should be -- an electron --.

Column 7,
Line 14, "substrata" should be -- substrate --.

Signed and Sealed this

Fifteenth Day of July, 2003

JAMES E. ROGAN
*Director of the United States Patent and Trademark Office*